(12) United States Patent
Schroeder et al.

(10) Patent No.: US 8,754,321 B2
(45) Date of Patent: Jun. 17, 2014

(54) LAMINATED THIN FILM METAL-SEMICONDUCTOR MULTILAYERS FOR THERMOELECTRICS

(75) Inventors: Jeremy Leroy Schroeder, West Lafayette, IN (US); Timothy David Sands, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 335 days.

(21) Appl. No.: 12/957,385

(22) Filed: Nov. 30, 2010

(65) Prior Publication Data
US 2011/0126874 A1 Jun. 2, 2011

Related U.S. Application Data

(60) Provisional application No. 61/265,170, filed on Nov. 30, 2009.

(51) Int. Cl.
*H01L 35/14* (2006.01)
*H01L 35/28* (2006.01)
*H01L 35/30* (2006.01)
*H01L 35/12* (2006.01)
*H01L 35/20* (2006.01)

(52) U.S. Cl.
USPC ........... 136/239; 136/203; 136/205; 136/211; 136/236.1; 136/241

(58) Field of Classification Search
CPC ...................................... H01L 35/22
USPC ............... 136/203, 205, 211, 239, 241, 236.1
See application file for complete search history.

(56) References Cited

U.S. PATENT DOCUMENTS

| 3,125,860 A * | 3/1964 | Reich ............................. 62/3.7 |
| 3,136,134 A * | 6/1964 | Smith ............................. 62/3.7 |
| 6,288,321 B1 * | 9/2001 | Fleurial et al. ................ 136/205 |
| 2007/0125416 A1 * | 6/2007 | Iwanade et al. ............ 136/236.1 |

OTHER PUBLICATIONS

Rawat et al., J. Appl. Phys. 105, 024909 (2009).*
Mayer PM and Ram RJ, Optimization of Heat Sink-Limited Thermoelectric Generators; Nanoscale and Microscale Thermophysical Engineering, vol. 10, Issue 2, pp. 143-155, Jul. 2006.

* cited by examiner

*Primary Examiner* — Eli Mekhlin
(74) *Attorney, Agent, or Firm* — C. John Brannon; Brannon Sowers & Cracraft PC (57) ABSTRACT

A thermoelectric segment and a method for fabricating. The fabricating includes forming structures by depositing thin-film metal-semiconductor multilayers on substrates and depositing metal layers on the multilayers, joining metal bonding layers to form dual structures with combined bonding layers; and removing at least one of the substrates; and using the dual structure to form a thermoelectric segments. The method can include dicing the dual structures before or after removing the substrates. The method can include depositing additional bonding layers and joining dual structures to make thermoelectric segments of different thicknesses. Each multilayer can be about 5-10 μm thick. Each bonding layer can be about 1-2 μm thick. The bonding layers can be made of a material having high thermal and electrical conductivity. The multilayers can be (Hf,Zr,Ti,W)N/(Sc,Y,La,Ga,In,Al)N superlattice layers. Metal nitride layers can be deposited between each of the bonding layers and multilayers.

9 Claims, 9 Drawing Sheets

LAMINATED THIN FILM METAL-SEMICONDUCTOR MULTILAYERS FOR THERMOELECTRICS

GOVERNMENTAL SUPPORT INFORMATION

This invention was made with government support from the Office of Naval Research under grant/contract number 103638 with project title "Copper-Copper Bonding for Laminated Thermoelectric Element." The Government has certain rights in the invention.

CROSS-REFERENCE TO RELATED APPLICATIONS

This application claims the benefit of U.S. Provisional Application Ser. No. 61/265,170, filed on Nov. 30, 2009, entitled "Laminated Thin Film Metal-Semiconductor Multilayers For Thermoelectrics" which is incorporated herein by reference.

BACKGROUND

The present invention relates to the field of thermoelectric devices, and more particularly to thermoelectric devices for the direct generation of electric power from a heat flux (Seebeck effect) and pumping of heat using applied electric power (Peltier effect).

Current commercialized thermoelectric elements are typically bulk materials with thermoelectric figure of merit (ZT) values around one. New thin film thermoelectric materials based on metal-semiconductor (M-S) multilayers are currently being developed in order to improve ZT to levels that will make thermoelectric power generation more practical. Maximum power densities for such M-S multilayers are achieved when thermoelectric leg thicknesses are on the order of 50-200 μm. However, due to constraints associated with standard thin film deposition techniques (e.g. sputtering), these M-S multilayers have practical thickness limits of 10-20 μm. In addition, optimal M-S multilayer film quality is often achieved for thickness values less than 10 μm.

Mayer and Ram's work (Mayer P M and Ram R J, "Optimization of Heat Sink-Limited Thermoelectric Generators"; Nanoscale and Microscale Thermophysical Engineering, Volume 10, Issue 2, pages 143-155, July 2006) highlights some of the challenges in using thin-film thermoelectric materials. They point out that the leg length must be on the order of about 100 microns, depending on the heat transfer coefficients, in order to reach the maximum power point. Any thinner and the performance will be limited by the inability to maintain the temperature difference, and/or by the parasitic electrical interface resistance.

Metal-semiconductor multilayers are currently being explored as new thermoelectric materials with high thermoelectric figures of merit (ZT). These metal-semiconductor multilayers are typically deposited by reactive DC sputtering, a thin film deposition technique suitable for industrial scale-up.

Due to the finite heat transfer coefficients of available heat sinks, thin-film based thermoelectric power generators demonstrate maximum power density at specific leg lengths. For example, forced water convection and heat-sinking technology have optimal leg lengths of 400 μm and 20 μm, respectively. The 20-400 μm range is impractical for sputtering high quality M-S multilayers, which means a disconnect exists between the thermoelectric thickness requirements for maximum power density and thickness limits for high-quality sputtered thin films. This disconnect can be overcome using laminated M-S multilayers disclosed herein.

SUMMARY

The present invention is not the same as segmented thermoelectric devices, but the two ideas can be compared. Segmented thermoelectric devices bond 2 to 4 thick segments together, each of which is tuned to perform at a different optimal temperature. In the present invention, very thin films can be laminated to build up a segment. Laminated segments, each tuned to a specific temperature, can then be bonded together as they are with current bulk technology.

Two M-S multilayers can be joined via thermal compression bonding using a metal bonding layer. The M-S multilayer substrates are selectively removed, resulting in a M-S bilayer. Any number of these bilayers can then be stacked and laminated using metal bonding layers. The thermal and electrical impedance of the bonding layers should constitute less than about 10% of the overall thermal and electrical impedance. Such criteria place limits on the properties of the metal bonding layer. The metal bonding layer can have both high thermal and electrical conductivity as well as a contact resistance on the order of $1 \times 10^{-8}$ Ohm-cm$^2$.

A method for fabricating metal-semiconductor multilayers for thermoelectrics is disclosed that includes depositing a first thin-film metal-semiconductor (M-S) multilayer on a first substrate and depositing a second thin-film M-S multilayer on a second substrate. The first thin-film M-S multilayer forms a first face against the first substrate and a second face opposite the first face. The second thin-film M-S multilayer forms a first face against the second substrate and a second face opposite the first face. The method also includes depositing a first metal bonding layer on the second face of the first thin-film M-S multilayer to form a first structure, and depositing a second metal bonding layer on the second face of the second thin-film M-S multilayer to form a second structure. The first structure comprising the first substrate, the first thin-film metal-semiconductor multilayer and the first metal bonding layer; and the second structure comprising the second substrate, the second thin-film metal-semiconductor multilayer and the second metal bonding layer. The method also includes joining the first metal bonding layer to the second metal bonding layer to form a dual structure with a combined bonding layer, the dual structure comprising the first substrate, the first thin-film metal-semiconductor multilayer, the combined bonding layer, the second thin-film metal-semiconductor multilayer and the second substrate. The method also includes removing at least one of the first substrate and the second substrate from the dual structure; and using the dual structure to form a laminated thermoelectric segment. The method can also include dicing the dual structure with the combined bonding layer before removing at least one of the first substrate and the second substrate from the dual structure.

When both the first and second substrates are removed from the dual structure, the method can also include depositing a third metal bonding layer on the first face of the first thin-film metal-semiconductor multilayer of the dual structure; depositing a fourth metal bonding layer on the first face of the second thin-film metal-semiconductor multilayer of the dual structure; dicing the dual structure to form a plurality of metal-coated bilayers, and joining at least two of the metal-coated bilayers to form the laminated thermoelectric segment by bonding one of the third and fourth bonding layers of one metal-coated bilayer with one of the third and fourth bonding layers of another metal-coated bilayer. Each metal-coated bilayer comprises the third metal bonding layer, the first thin-film metal-semiconductor multilayer, the combined bonding layer, the second thin-film metal-semiconductor multilayer and the fourth bonding layer.

When both the first and second substrates are removed from the dual structure, the method can also include dicing the dual structure to form a plurality of bilayers, depositing an additional metal bonding layer on the first face of one of the first or second thin-film metal-semiconductor multilayers of the plurality of bilayers; joining a pair of the plurality of bilayers to form the laminated thermoelectric segment by bonding the additional metal bonding layer of one of the plurality of bilayers with the additional metal bonding layer of another of the plurality of bilayers, and then thickening the laminated thermoelectric segment. The laminated thermoelectric segment having a first end and a second end without a metal bonding layer. The thickening of the laminated thermoelectric segment includes depositing a further metal bonding layer on the first or second end of the laminated thermoelectric segment and joining a further bilayer of the plurality of bilayers by bonding the further metal bonding layer of the laminated thermoelectric segment with the additional metal bonding layer of the further bilayer of the plurality of bilayers. The thickening of the thermoelectric segment can be repeated until the desired thickness of the thermoelectric segment is reached.

When the second substrates is removed from the dual structure and the first substrate is not removed, the method can also include dicing the dual structure to form a plurality of handled bilayers, each handled bilayer comprising the first substrate, the first thin-film metal-semiconductor multilayer, the combined bonding layer and the second thin-film metal-semiconductor multilayer; depositing an additional metal bonding layer on the first face of the second thin-film metal-semiconductor multilayer of the plurality of handled bilayers; joining a pair of the plurality of handled bilayers to form a dual handled thermoelectric segment by bonding the additional metal bonding layer of one of the plurality of handled bilayers with the additional metal bonding layer of another of the plurality of handled bilayers; and removing the first substrate from both ends of the dual handled thermoelectric segment to form the thermoelectric segment. This method can also include, before removing the first substrate from both ends of the dual handled thermoelectric segment, thickening the thermoelectric segment by the following steps: removing the first substrate from one end of the dual handled thermoelectric segment to form a single handled thermoelectric segment; depositing a further metal bonding layer on the end of the single handled thermoelectric segment from which the first substrate was removed; and joining a further handled bilayer of the plurality of handled bilayers to the single handled thermoelectric segment to form a thickened dual handled thermoelectric segment by bonding the additional metal bonding layer of the further handled bilayer with the further metal bonding layer of the single handled thermoelectric segment. The thickening steps can be repeated until the desired thickness of the thermoelectric segment is reached. This method can also include depositing a metal bonding layer on each end of the thermoelectric segment from which the first substrate was removed.

The bonding layers can be made of a material having high thermal and electrical conductivity, for example, gold or copper. The joining of metal layers can be done using thermal compression bonding. The removing of at least one of the first substrate and the second substrate from the dual structure can be done by etching at least one of the first substrate and the second substrate. The first and second substrates can be made of silicon, magnesium-oxide or other suitable materials. A relatively thin metal nitride layer can be deposited on the first and second thin-film metal-semiconductor multilayers before depositing the first and second metal bonding layers. The first and second thin-film metal-semiconductor multilayers can be (Hf,Zr,Ti,W)N/(Sc,Y,La,Ga,In,Al)N superlattice layers.

A thermoelectric segment is disclosed that includes a plurality of thin-film metal-semiconductor multilayers, and a plurality of metal bonding layers, where a metal bonding layer is between each pair of the plurality of thin-film metal-semiconductor multilayers. Each of the plurality of thin-film metal-semiconductor multilayers can have a thickness of about 5-10 µm. Each of the metal bonding layers can have a thickness of about 1-2 µm. The metal bonding layers can be made of a material having high thermal and electrical conductivity, for example gold or copper. The plurality of thin-film metal-semiconductor multilayers can be (Hf,Zr,Ti,W)N/(Sc,Y,La,Ga,In,Al)N superlattice layers. The thermoelectric segment can also include a metal nitride layer between each of the plurality of metal bonding layers and each of the plurality of thin-film metal-semiconductor multilayers. The metal nitride layer can have a thickness of less than about 0.1 µm.

DESCRIPTION OF EXEMPLARY EMBODIMENTS

For the purposes of promoting an understanding of the principles of the novel technology, reference will now be made to the embodiments described herein and illustrated in the drawings and specific language will be used to describe the same. It will nevertheless be understood that no limitation of the scope of the novel technology is thereby intended, such alterations and further modifications in the illustrated devices and methods, and such further applications of the principles of the novel technology as illustrated therein being contemplated as would normally occur to one skilled in the art to which the novel technology relates.

The disconnect between optimal leg lengths for thermoelectric (TE) elements based on metal-semiconductor (M-S) multilayers and the thickness constraints imposed by the deposition methods used for such metal-semiconductor multilayers can be overcome as disclosed herein. High quality M-S multilayers on the order of 2-10 μm can be grown, and optimal thermoelectric device legs on the order of 50-200 μm can be fabricated by bonding these M-S multilayers. Therefore, the thermoelectric properties of the M-S multilayers can be optimized at practical film thickness values, and the optimal thermoelectric leg thickness can be achieved through lamination. Multilayers is a broad term of which polycrystalline superlattices are a subset. A polycrystalline superlattice is a multilayer composed of multiple crystalline grains where a superlattice structure exists within each grain.

The total contact resistance should be less than about 10% of the thermoelectric segment resistance. Evaluating an individual thermoelectric segment, the total resistance is the sum of the thermoelectric segment resistance and the two contact resistances. Assuming a thermoelectric resistivity of 1 mΩ-cm, the minimum thermoelectric segment thickness is 200 μm, 20 μm, and 2 μm for contact resistances of $1\cdot10^{-6}$ Ω-cm$^2$, $1\cdot10^{-7}$ Ω-cm$^2$, and $1\cdot10^{-8}$ Ω-cm$^2$, respectively. The thickness of high-quality sputtered M-S multilayers is typically less than 10 μm, making the desired contact resistance to be in the low $10^{-8}$ Ω-cm$^2$ range. These contact resistances are achievable with metal-metal contacts. Fortunately, M-S multilayers can be capped by metal on each side, allowing for metal-metal contacts to be deposited.

The thermoelectric segments can be laminated with metal bonding layers to achieve the optimal thermoelectric leg length for maximum power density. The metal bonding layers can introduce parasitics into the laminated thermoelectric leg. The electrical and thermal impedance of the metal bonding layers should be less than about 10% of the total electrical and thermal impedance of the thermoelectric leg to ensure that the parasitic resistance attributed to the interfaces is negligible. An exemplary calculation demonstrates that these criteria can be met with 5 μm thermoelectric segments and 2 μm gold-gold (Au—Au) bonding layers. Other thickness combinations are also possible, as are other metal bonding materials. Alternative metal bonding materials can include, for example, gold-copper (Au—Cu) and copper-copper (Cu—Cu). In this exemplary calculation, the following values are assumed:

Ten 5 μm thermoelectric segments,
Twenty 1 μm Au bonding layers,
$\kappa_{TE}$=3 W/m-K,
$\kappa_{Au}$=300 W/m-K,
$\rho_{contact}$=$1\cdot10^{-8}$ Ω-cm$^2$,
$R_{contact,\ thermal}$=$6\cdot10^{-8}$ K-m$^2$/W,
$\rho_{TE}$=$1\cdot10^{-3}$ Ω-cm, and
$\rho_{Au}$=$6\cdot10^{-6}$ Ω-cm.

Based on these assumptions, the electrical and thermal impedance of the thermoelectric segment is 96% and 93%, respectively, of the total electrical and thermal impedance of the thermoelectric leg. Therefore, assuming an electrical contact resistance of $1\cdot10^{-8}$ Ω-cm$^2$, it is possible to laminate thermoelectric segments to achieve optimal leg lengths for maximizing power density.

Figure 1:
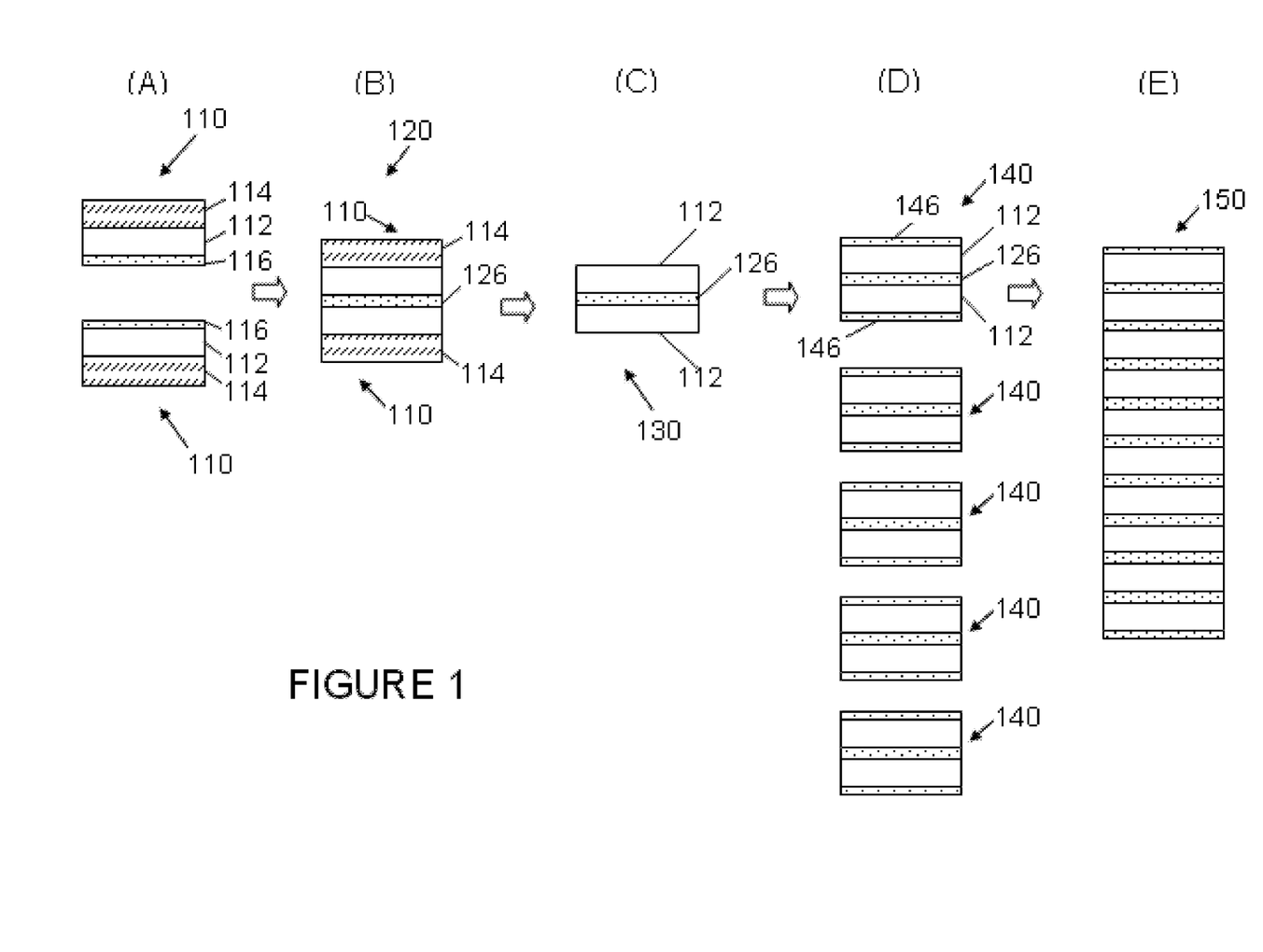
FIG. 1 illustrates steps in an exemplary process flow for fabricating thermoelectric laminates.

FIG. 1 illustrates steps in an exemplary process flow for fabricating thermoelectric laminates. In a deposit metal step (A), thin-film M-S multilayers 112 are deposited on a sacrificial substrate 114 that can be selectively etched. A metal bonding material 116 is subsequently deposited on top of the M-S multilayer 112 to form a structure 110. The bonding material can have high thermal and electrical conductivity (e.g. copper or gold) such that the bonding material does not dominate the final thermoelectric device properties.

In a bonding step (B), two structures 110 from the deposit metal step (i.e. substrate 114/M-S multilayer 112/bonding material 116) are stacked together, with their bonding material layers 116 facing each other. The bonding material layers 116 of the two structures 110 are joined to form a bond 126 that joins the two structures 110 to form a joined structure 120. The joining can be done using thermal compression bonding. The joined structure 120 can then be diced to form a plurality of smaller joined structures 120. For example, the original joined structure 120 formed by joining the structures 110 could have a diameter of about 2 inches and this original joined structure 120 can be diced into smaller joined structure 120 of a desired size, for example 5 mm×5 mm.

In an etch substrate step (C), the two substrates 114 are selectively removed from the joined structure 120, resulting in a bonded bilayer 130. Due to symmetry across the bond 126, residual film stress is generally balanced resulting in a bilayer 130 having low overall stress. In an alternative method, the substrate etching can be done before the dicing and the bilayer 130 can be diced. The bilayer 130 can be coated with a protective material (for example, photoresist) before dicing the bilayer 130 to prevent damage from dicing debris.

In a coat bilayer step (D), additional metal bonding or contact material 146 can be deposited on each side of the bilayers 130 to form a coated bilayer 140. In an alternative method, the bonding material 146 can be deposited on the bilayer 130 before dicing and the coated bilayer 140 can be diced to form smaller coated bilayers 140.

In a bilayer joining step, many coated bilayers 140 can be joined, resulting in a laminated thermoelectric segment 150. The joining can be done using thermal compression bonding. The laminated bilayers 140 can be joined to create thermoelectric segments of any desired thickness.

Alternatively, in the etch substrate step (C), only one of the substrates 114 can be selectively removed from the joined structures 110 so that the bonded laminates 130, 140 are always attached to a handle substrate 114. The handle substrate 114 of a bonded laminate 130, 140 can then be removed as needed for depositing additional metal bonding material 146 and joining with another bonded laminate 130, 140. The advantage of this approach is that the thin films can easily be handled and the M-S multilayers remain flat during the processing steps.

An alternative exemplary process flow for fabricating thermoelectric laminates is explained below that avoids having to handle thin bilayers by themselves. This process has more steps, but it minimizes potential damage from handling bilayers without handle substrates.

The deposit metal step (A) and bonding step (B) are as described above, without dicing. In the deposit metal step (A), thin-film M-S multilayers 112 are deposited on a sacrificial substrate 114 that can be selectively etched, and a metal bonding material 116 is subsequently deposited on top of the M-S multilayer 112 to form a structure 110. In the bonding step (B), two structures 110 from the deposit metal step (i.e. substrate 114/M-S multilayer 112/bonding material 116) are stacked together, with their bonding material layers 116 facing each other. The bonding material layers 116 of the two structures 110 are joined to form a bond 126 that joins the two structures 110 to form a joined structure 120.

After the joined structure 120 is formed, the substrate 114 is etched from one side of the joined structure 120 to expose the M-S multilayer 112 that was previously covered by the removed substrate 114. This effectively results in a bilayer 130 with a substrate 114 attached to one end and an exposed M-S multilayer 112 at the opposite end. Bonding material 146 is then deposited on the exposed M-S multilayer 112 end of the bilayer 130. The entire sample (remaining substrate 114, bilayer 130 and bonding material 146) can then be diced in half and the two halves joined together at the bonding material ends. This results in a 4-layer laminate from the two bonded bilayers 130 with a substrate 114 at each end.

Repeating the process of etching the substrate from one side, coating the exposed M-S multilayer with bonding material, dicing the entire sample in half and bonding the two halves at the bonding material ends results in an 8-layer laminate with a substrate at each end. By continuing to repeat this process a laminate with 16, 32, 64, 128, etc layers can be created. When a laminate of the desired thickness or number of layers is created, the substrate can be removed from both ends and metal contact layers can be deposited at the ends. Numerous variations of this process will be apparent to one of skill in the art.

An exemplary process flow that successfully laminated a plurality of 5 µm M-S thermoelectric segments will now be disclosed. This exemplary process flow does not indicate the only method for achieving thermoelectric laminates, but it does provide an example of how thermoelectric laminates can be fabricated.

A 300 nm $(Hf_{0.5}Zr_{0.5})N$ buffer layer and 5 µm M-S multilayer was reactively sputtered on a 2" 100-Si substrate with a 50 nm thermal oxide. The M-S multilayer included 416 periods of 6 nm ScN and 6 nm $(Hf_{0.5}Zr_{0.5})N$. The final layer in the M-S multilayer sequence was a metal nitride (6 nm $(Hf_{0.5}Zr_{0.5})N$), ensuring a metal-metal contact during subsequent deposition of the metal bonding layer. The thermal oxide was included as an etch stop for the silicon substrate etching step, but was later discovered to be redundant as the metal buffer layer is resistant to the silicon etchant, tetramethyl ammonium hydroxide (TMAH).

A metal bonding layer (5 nm Ti/1 µm Au) was then sputter deposited onto the M-S multilayers of two such 2" wafers. The two wafers were subsequently stacked together, with gold facing each other, and bonded (Suss SB6e bonder) under vacuum at 350° C. and 3.3 MPa for 30 minutes.

The bonded stack was diced into 1 cm×1 cm pieces and placed in a 25 wt % TMAH solution at 75° C. until the silicon (Si) was fully etched. The TMAH solution selectively etches the Si compared to both the oxide layer and the $(Hf_{0.5}Zr_{0.5})N$ buffer. ScN apparently etches in TMAH, but it is protected by the $(Hf_{0.5}Zr_{0.5})N$ buffer layers. After removal of the silicon, the about 12 µm bilayers were dipped in 6:1 buffered oxide etch (BOE) for 1 minute to ensure removal of the thermal oxide. BOE has been shown to etch the $(Hf_{0.5}Zr_{0.5})N$ so there may be partial etching of the $(Hf_{0.5}Zr_{0.5})N$ buffer layer as well. Three of these 1 cm×1 cm bilayers were then used for laminate testing.

A metal bonding layer (5 nm Ti/1 µm Au) was sputter deposited on both sides of the three bilayers. The three bilayers were stacked together and bonded (Suss SB6e bonder) under vacuum at 350° C. and 3.3 MPa for 30 minutes. The resulting laminate was approximately 42 µm thick with 30 µm of M-S multilayers and 12 µm of Au bonding layers. This exemplary process flow demonstrated that bonded M-S bilayers can be laminated to create thermoelectric segments of any desired thickness.

Figure 2:
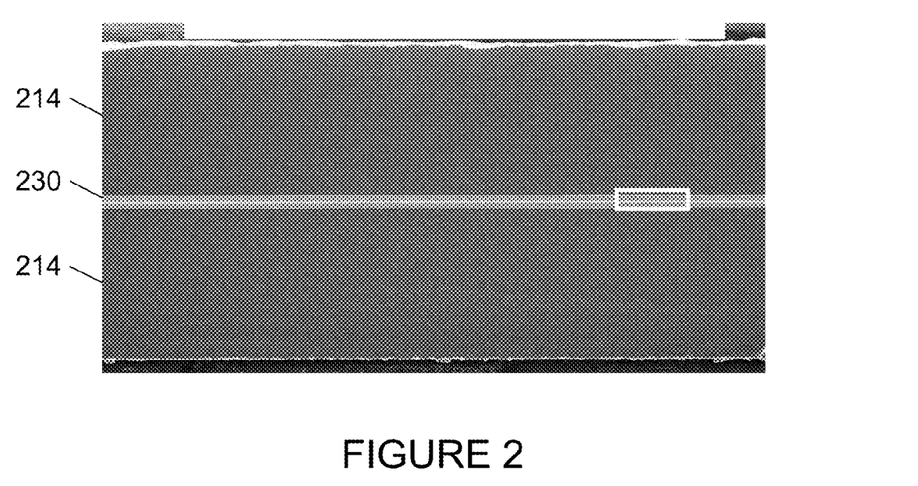
FIG. 2 is a cross-section FESEM image showing a bilayer including two metal-semiconductor polycrystalline superlattices deposited on silicon substrates and bonded with a Cu—Au bonding layer.

FIG. 2 is a cross-section Field Emission Scanning Electron Microscope (FESEM) image showing an exemplary embodiment of a joined structure (see FIG. 1(B)) that includes a first silicon (Si) substrate 214 and a second silicon substrate 214 on the top and bottom of a bilayer 230.

Figure 3:
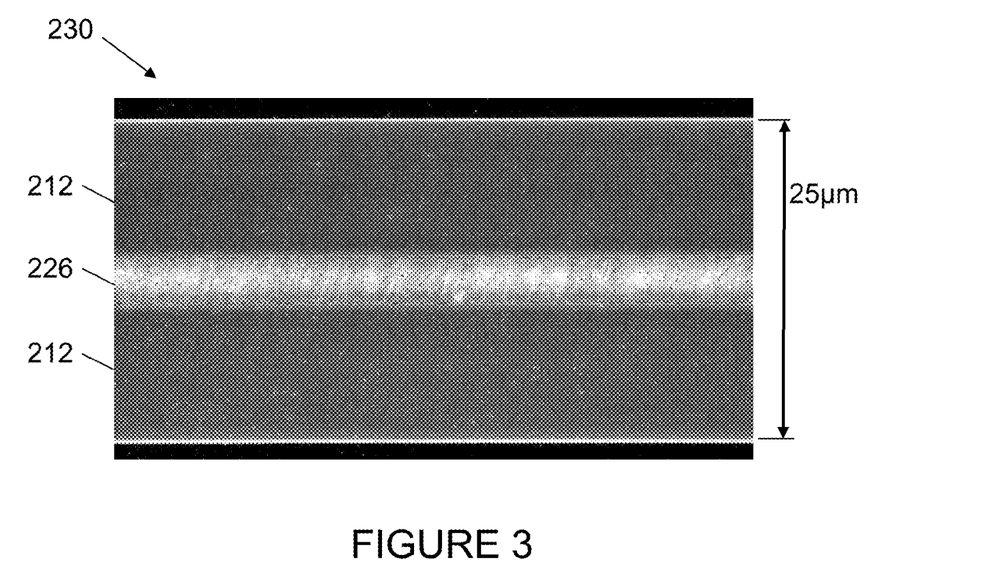
FIG. 3 is a higher magnification FESEM image of a portion of FIG. 2 showing two 10 µm metal-semiconductor multilayers of (Hf,Zr)N/ScN superlattice bonded via Cu—Au thermal compression bonding.
Figure 4:
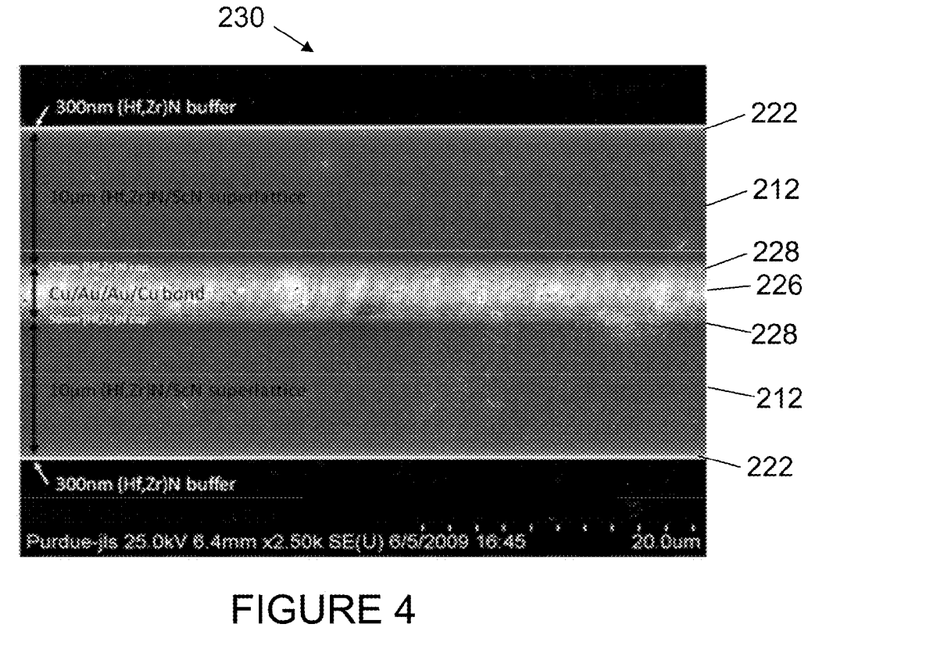
FIG. 4 is another higher magnification FESEM image of two bonded metal-semiconductor multilayers of (Hf,Zr)N/ScN superlattice showing buffer layers.

FIG. 3 shows a higher magnification image of the highlighted area of the bilayer 230 of FIG. 2. The bilayer 230 is approximately 25 µm thick and includes two 10 µm M-S multilayers 212 of (Hf,Zr)N/ScN superlattice bonded via Cu—Au thermal compression bonding. FIG. 4 shows another higher magnification image of the bilayer 230 showing additional layers. The bilayer 230 includes a 300 nm (Hf,Zr)N buffer layer 222 at the top and the bottom of the bilayer 230 surrounding the 10 µm (Hf,Zr)N/ScN superlattice layers 212 with a Cu/Au/Au/Cu bond 226 in the middle. A 50 nm (Hf, Zr)N cap 228 is on each side of the bond 226 between the bond 226 and the superlattice layers 212.

Figure 5:
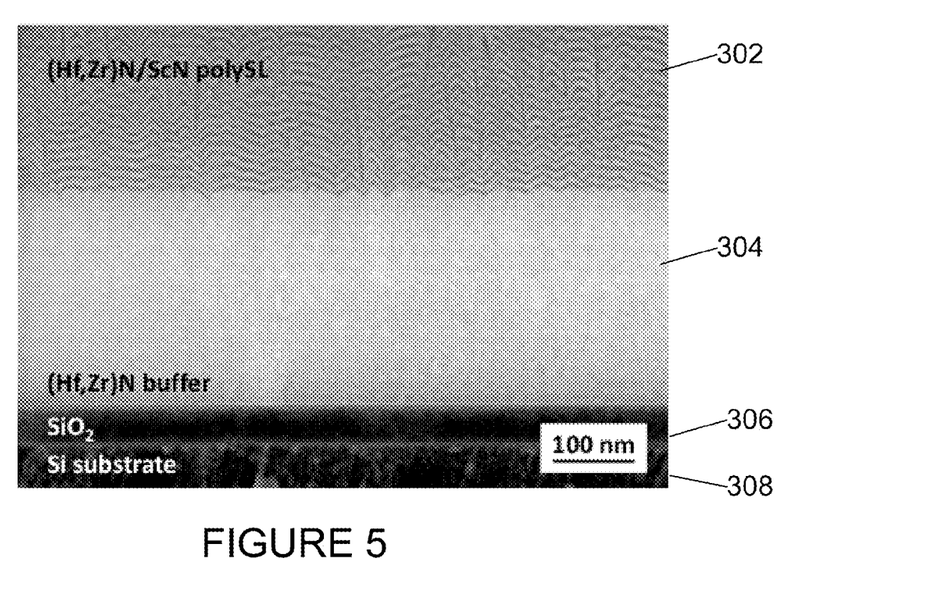
FIG. 5 is a cross-section FESEM image showing the structure of the metal-semiconductor poly-superlattice deposited on a 100-silicon substrate.

FIG. 5 is a cross-section FESEM image showing the structure of the metal-semiconductor poly-superlattice deposited on a 100-silicon substrate. The layers include a (Hf,Zr)N/ScN poly-superlattice 302, a (Hf,Zr)N buffer 304, silicon-dioxide $(SiO_2)$ layer 306 and the silicon (Si) substrate 308. The films are composed of uniaxially textured grains with coherent interfaces (i.e. superlattices) within each grain.

Figure 6:
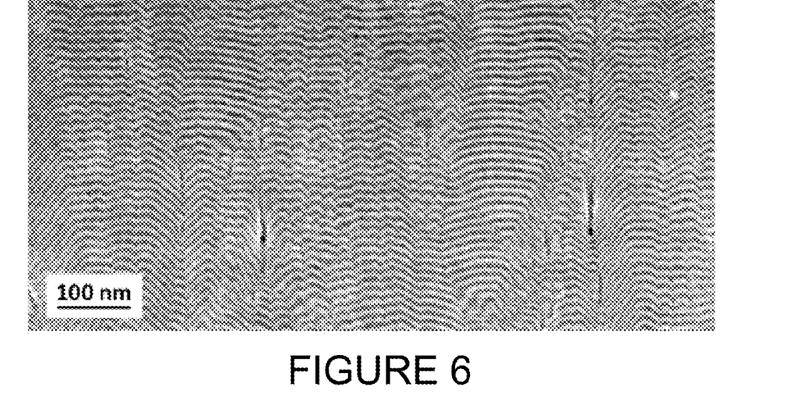
FIG. 6 is a cross-section FESEM image showing the structure of the metal-semiconductor poly-superlattice.

FIG. 6 is a cross-section FESEM image showing the structure of the metal-semiconductor poly-superlattice. In this embodiment the poly-superlattice is a (Hf,Zr)N/ScN poly-superlattice.

Figure 7A:
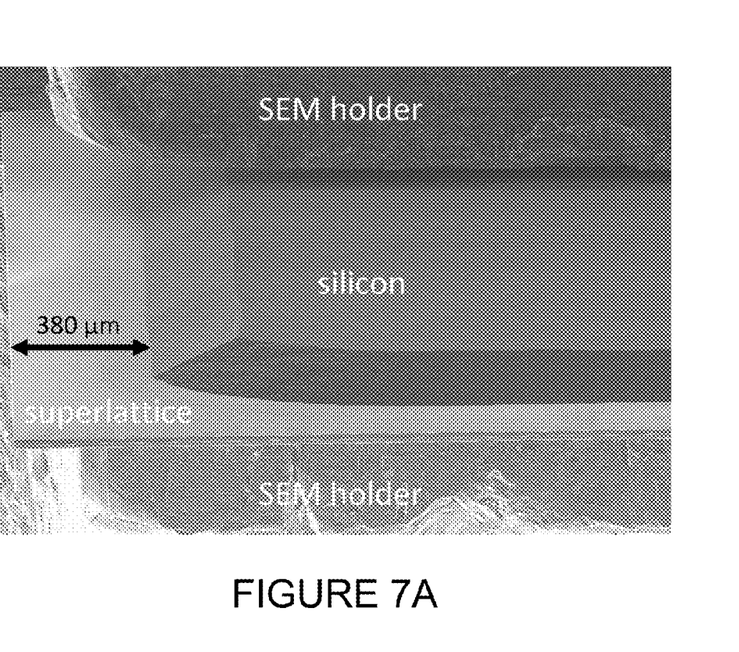
FIG. 7A is a tilted top-view low magnification FESEM image of a silicon substrate partially etched from a superlattice bilayer.
Figure 7B:
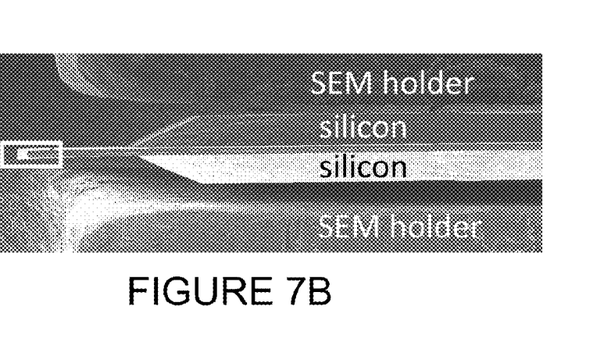
FIG. 7B is a side-view FESEM image of the upper and lower silicon substrates partially etched from the superlattice bilayer.
Figure 7C:
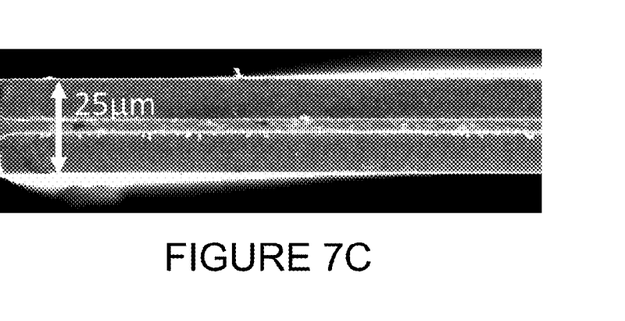
FIG. 7C is a higher magnification FESEM image of the highlighted portion of the superlattice bilayer shown in FIG. 7B.

FIG. 7 shows FESEM images of silicon substrates partially etched from a super-lattice bilayer. The etching was done using TMAH. FIG. 7A is a tilted low magnification top view showing the scanning electron microscope (SEM) holders holding the partially etched silicon substrate and the superlattice bilayer. Approximately 380 µm of the silicon substrate has been etched from the end exposing the underlying superlattice layer of the bilayer. FIG. 7B is a side-view showing the planar bilayer sticking out like a beam and the upper and lower silicon substrates partially etched from the bilayer. Residual film stress is balanced across the bonding layer, resulting in the planar bilayer. FIG. 7C is a higher magnification image of the highlighted portion of FIG. 7B showing the two 10 µm M-S multilayers of the bilayer bonded together by a Cu—Au bond.

Figure 8:
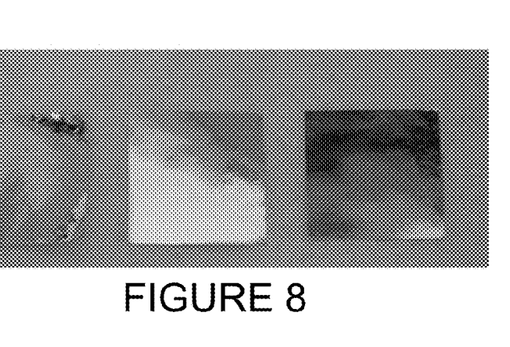
FIG. 8 is a digital image of three 1 cm×1 cm laminated metal-semiconductor multilayer foils after selectively etching the silicon substrates.
Figure 9:
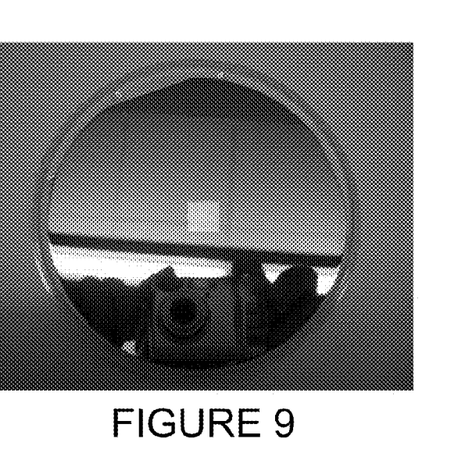
FIG. 9 is a digital image of the three metal-semiconductor bilayers of FIG. 8 bonded together to form a 42 µm laminated foil.

FIG. 8 shows three 1 cm×1 cm laminated M-S multilayer foils after selectively etching the silicon substrates. Each of the laminated M-S multilayer foils is approximately a 12 µm M-S bilayer including two 5 µm $(Hf_{0.5}Zr_{0.5})N$/ScN M-S multilayers bonded with a 2 µm gold bonding layer. FIG. 9 is a digital camera image of the three M-S bilayers shown in FIG. 6 bonded together to form a 42 µm laminated foil. The laminated foil includes six approximately 5 µm M-S multilayers and approximately 12 µm of gold bonding material in the bonding layers. The digital camera image shows the laminated foil on a 4" silicon substrate that was used as a platform in the bonding system.

Figure 10:
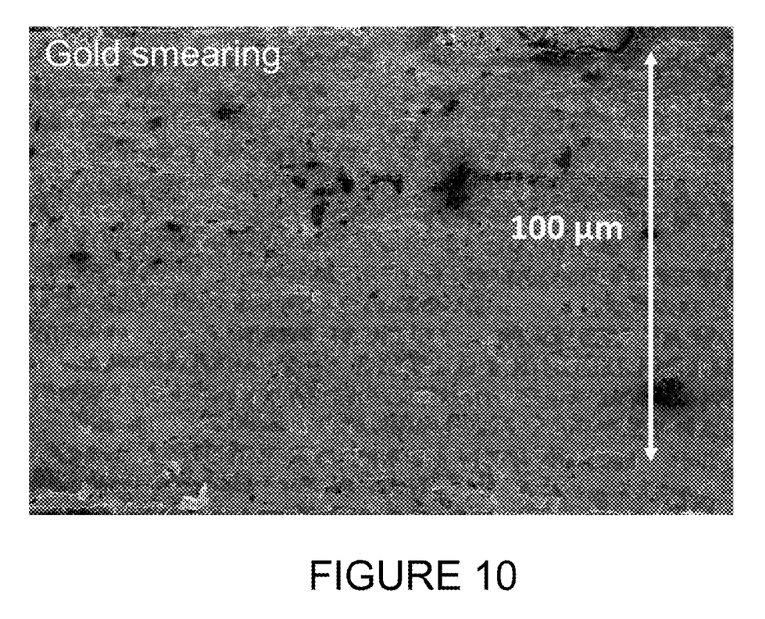
FIG. 10 is a cross-section SEM image of a multilayer laminated foil after dicing and before polishing.
Figure 11:
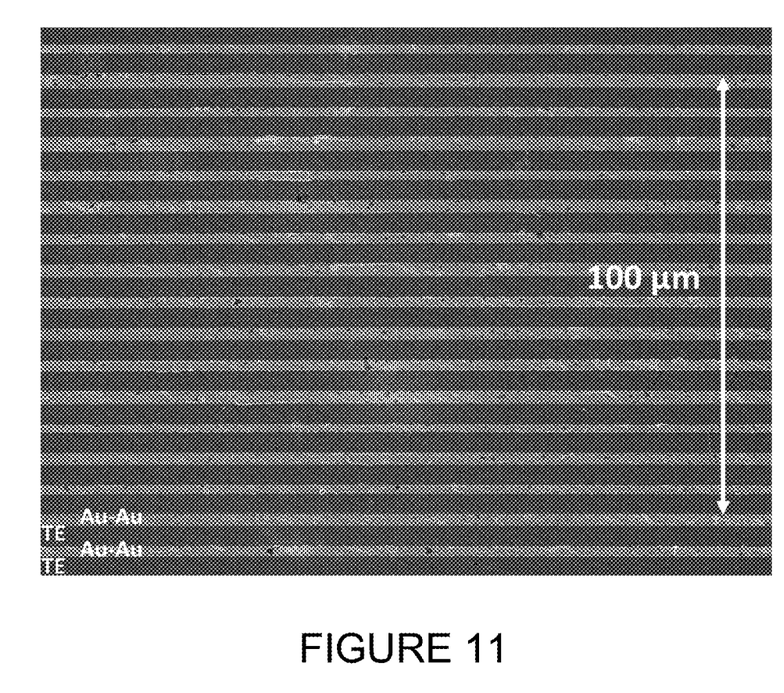
FIG. 11 is a cross-section SEM image of the multilayer laminated foil of FIG. 10 after polishing showing the separate M-S layers and bonding layers.
Figure 12:
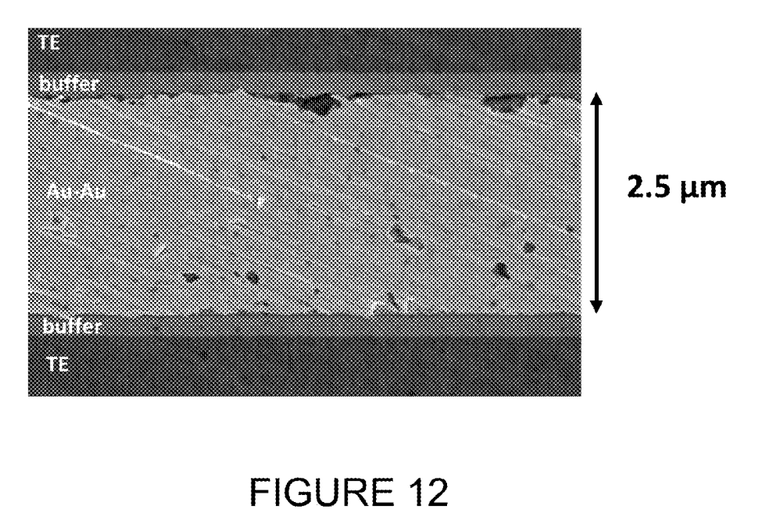
FIG. 12 is a higher magnification cross-section SEM image of a portion of a single bonding layer of the multilayer laminated foil of FIG. 11.

FIG. 10 is a cross-section SEM image of a portion of a laminate after dicing with eighteen M-S layers and seventeen bonding layers before polishing. The layers are not clearly seen due to gold smearing during the dicing process. The smearing can be reduced by using different materials and different dicing methods. FIG. 11 shows the same portion of the laminate shown in FIG. 10 after polishing. After polishing the M-S layers and bonding layers can be clearly seen. FIG. 12 shows a higher magnification SEM image of an individual bonding layer between two thermoelectric layers. The bonding layer is approximately 2.5 µm thick and a buffer layer is used in this embodiment between the bonding layer and the M-S layers. The buffer layer can be grown to improve film quality.

It should be noted that the bonding material is not restricted to gold. Other exemplary metal bonding layer combinations that have been explored include copper-gold (Cu—Au) and copper-copper (Cu—Cu).

It should also be noted that the M-S multilayers can be made of various materials including, for example, a metal nitride and a nitride semiconductor. For example, the metal nitride can be a single transition metal nitride or an alloy with components such as hafnium nitride (HfN), zirconium nitride (ZrN), titanium nitride (TiN) or tungsten nitride (W—N) and the nitride semiconductor can be a nitride such as scandium nitride (ScN), yttrium nitride (YN), lanthanum nitride (LaN), gallium nitride (GaN), indium nitride (InN) or aluminum nitride (AlN) or an alloy of any of the above. These multilayers can also be doped with various doping elements.

The exemplary process flow described above involves the lamination of M-S bilayers. While these thin bilayers (~10 µm) are fairly rigid, it may not be desirable to handle such thin foils during processing steps. This potential problem can easily be remedied by removing one silicon substrate at a time, thereby leaving a silicon handle substrate. The silicon handle substrate helps ensure that the bonded stacks remain flat, and that they are less susceptible to handling damage.

In addition to silicon substrates, other substrates can be selected so long as the substrate can be selectively removed with respect to the M-S multilayer. Other substrate selections might afford higher quality M-S multilayers. For example, a magnesium oxide (MgO) substrate can be used for the growth of rocksalt metal nitrides.

Figure 13:
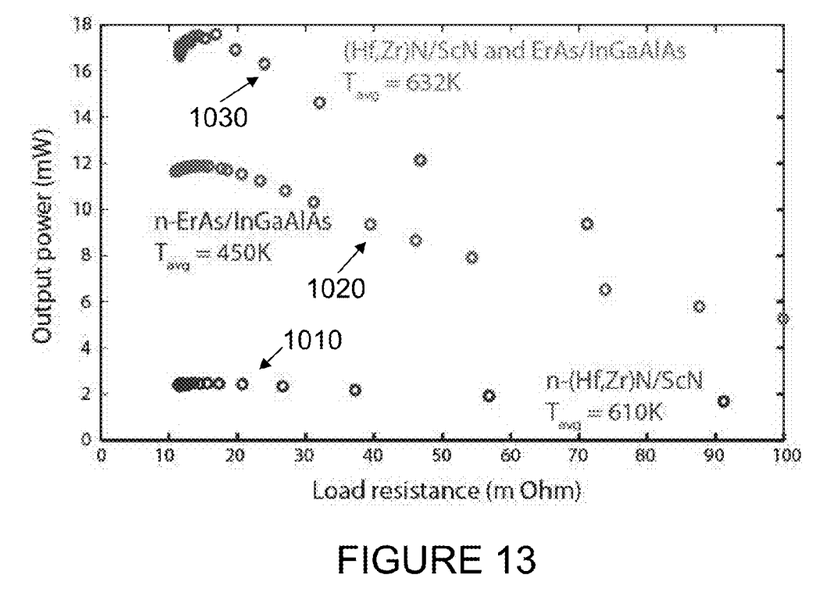
FIG. 13 shows Z-meter measurements that show power generation from laminated thin-film thermoelectrics.

FIG. 13 includes Z-meter measurements that show power generation from laminated thin-film thermoelectrics. The bottom curve 1010 shows measurements taken from two identical 25 µm bilayers stacked on top of one another. The middle curve 1020 shows measurements taken from an ErAs/InGaAlAs segment. The top curve 1030 shows measurements taken from a 25 µm bilayer stacked on top of an ErAs/InGaAlAs segment, creating a segmented TE.

Figure 14:
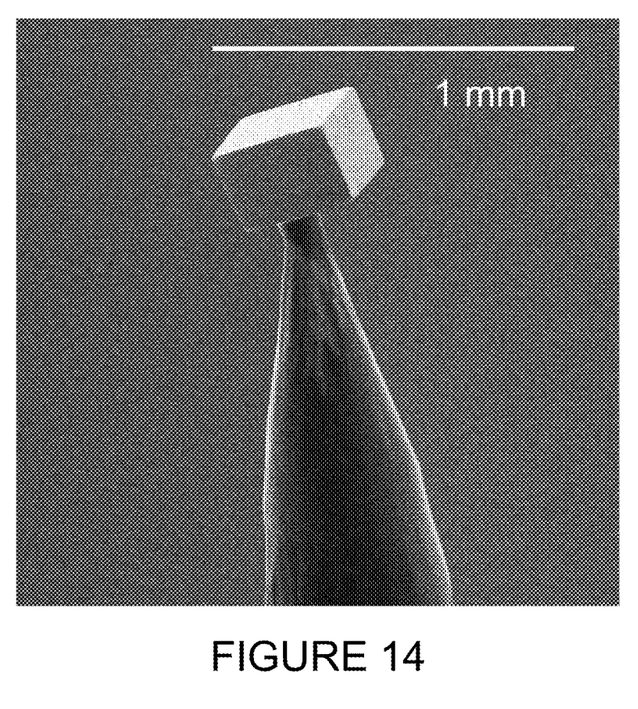
FIG. 14 is an FESEM image of a laminate on the tip of a sewing pin.
Figure 15:
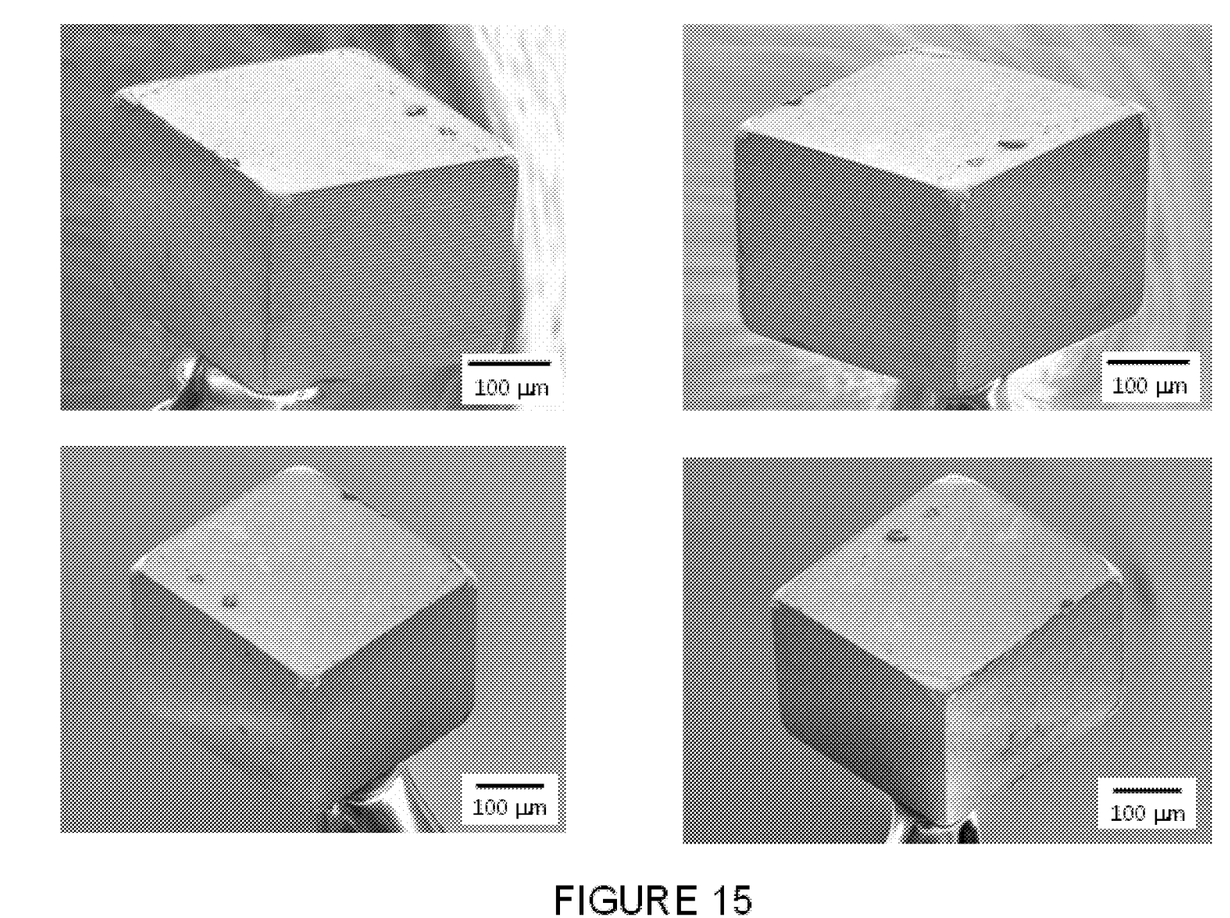
FIG. 15 is four higher resolution FESEM images of the laminate of FIG. 14 showing the four polished sides of the laminate.

FIG. 14 is an FESEM image of a laminate on the tip of a sewing pin. The laminate includes 40 thermoelectric layers or 20 bilayers and each thermoelectric layer has a thickness of approximately 5 µm. The laminate also includes 80 gold bonding layers, each having a thickness of approximately 1 µm. The dimensions of the laminate are approximately 300 µm×300 µm×280 µm. The laminate was diced and polished using a 3 µm diamond lapping disc. FIG. 15 is four higher resolution FESEM images of the laminate of FIG. 14 showing the four polished sides of the laminate.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains.

We claim:

1. A thermoelectric segment comprising:
a plurality of bilayers; and
a plurality of metal bonding layers, a respective metal bonding layer being between each respective pair of the plurality bilayers;
wherein each respective bilayer comprises a pair of respective thin-film metal-semiconductor multilayers, each positioned on opposite sides of respective metal bond layer;
wherein each respective multilayer includes a plurality of metal layers and a plurality of alternating semiconductor layers;
wherein respective semiconducting layers are disposed between two respective metal layers;
wherein respective metal layers are disposed between two semiconducting layers;
wherein each respective metal bonding layer is adjacent a layer selected from the group comprising bilayers, metal bonding layers and air;
wherein the maximum distance between two metal bonding layers is between 50 µm and 200 µm; and
wherein the plurality of thin-film metal-semiconductor multilayers are of the form XN/QN superlattice layers, where X is selected from the group comprising Hf, Zr, Ti, W and combinations thereof, and Q is selected from the group comprising Sc, Y, La, Ga, In, Al and combinations thereof.

2. The thermoelectric segment of claim 1, wherein each of the plurality of thin-film metal-semiconductor multilayers has a thickness of about 5-10 µm.

3. The thermoelectric segment of claim 2, wherein each of the metal bonding layers has a thickness of about 1-2 µm.

4. The thermoelectric segment of claim 3, wherein the metal bonding layers are made of a material having high thermal and electrical conductivity.

5. The thermoelectric segment of claim 1, further comprising a metal nitride layer between each of the plurality of metal bonding layers and each of the plurality of thin-film metal-semiconductor multilayers; the metal nitride layer having a thickness of less than about 0.1 µm.

6. A thermoelectric stack, comprising:
a plurality of metal-semiconductor bilayers; and
a plurality of metal bonding layers, a respective metal bonding layer being between two respective metal-semiconductor bilayers to define a respective stacking having a respective first end and a respective second end;
a plurality of metal terminal layers, wherein a respective metal terminal layer is disposed at each respective first and respective second end;
wherein each respective metal semiconductor bilayer comprises a metal layer positioned between a pair of respective polycrystalline superlattice layers;
wherein each respective bilayer is disposed between two metal bonding layers;

wherein each polycrystalline superlattice layer comprises a plurality of crystalline grains;
wherein each respective crystalline grain contains a superlattice structure;
wherein the distance between each respective metal terminal layer is between 50 µm and 200 µm; and
wherein the respective polycrystalline superlattice layers are of the form XN/QN, where X is selected from the group comprising Hf, Zr, Ti, W and combinations thereof, and Q is selected from the group comprising Sc, Y, La, Ga, In, Al and combinations thereof.

7. The thermoelectric stack of claim 6, wherein the respective bonding layers are selected from the group comprising copper, silver, gold, and combinations thereof.

8. A bulk-like thermoelectric material, comprising:
a plurality of polycrystalline superlattice layers; and
a plurality of alternatingly positioned metal layers;
wherein each polycrystalline superlattice layer comprises a plurality of crystalline grains;
wherein each respective crystalline grain contains a superlattice structure;
wherein each polycrystalline superlattice layer is positioned in electrical contact with two respective alternatingly positioned metal layers;
wherein the pluralities of alternating metal layers and polycrystalline superlattice layers define a thermoelectric element;
wherein the thermoelectric element is between about 50 µm and about 300 µm thick;
wherein contact resistance between a respective metal layer contacting a respective superlattice layer is less than about $10^{-8}$ $\Omega$-cm$^2$; and
wherein the respective polycrystalline superlattice layers are of the form XN/QN, where X is selected from the group comprising Hf, Zr, Ti, W and combinations thereof, and Q is selected from the group comprising Sc, Y, La, Ga, In, Al and combinations thereof.

9. The material of claim 8, wherein each respective metal layer is selected from the group comprising copper, silver, gold, and combinations thereof.

* * * * *